United States Patent
Ho et al.

(10) Patent No.: US 7,807,526 B2
(45) Date of Patent: Oct. 5, 2010

(54) METHOD OF FABRICATING HIGH-DENSITY, TRENCH-BASED NON-VOLATILE RANDOM ACCESS SONOS MEMORY CELLS FOR SOC APPLICATIONS

(75) Inventors: Herbert L. Ho, New Windsor, NY (US); Jack A. Mandelman, Flat Rock, NC (US); Tak H. Ning, Yorktown Heights, NY (US); Yoichi Otani, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/928,615

(22) Filed: Oct. 30, 2007

(65) Prior Publication Data

US 2008/0057647 A1 Mar. 6, 2008

Related U.S. Application Data

(62) Division of application No. 10/907,686, filed on Apr. 12, 2005.

(51) Int. Cl.
*H01L 21/8238* (2006.01)
(52) U.S. Cl. .................. 438/212; 438/268; 257/E21.41
(58) Field of Classification Search .................. 438/212, 438/268, 216, 259, 261, 270, 271, 591, 593; 257/E21.41, 324, 328, 330
See application file for complete search history.

(56) References Cited

U.S. PATENT DOCUMENTS

| | | | |
|---|---|---|---|
| 5,051,917 A | 9/1991 | Gould et al. | |
| 5,313,419 A | 5/1994 | Chang | |
| 5,424,569 A | 6/1995 | Prall | |
| 5,598,367 A | 1/1997 | Noble | |
| 5,616,510 A | 4/1997 | Wong | |
| 6,239,465 B1 | 5/2001 | Nakagawa | |
| 6,444,525 B1 | 9/2002 | Lee | |

(Continued)

FOREIGN PATENT DOCUMENTS

CN 1540762 10/2009

(Continued)

OTHER PUBLICATIONS

Swift, et al., "An embedded 90nm SONOS nonvolatile memory utilizing hot electron programming and uniform tunnel erase," *IEDM Tech. Dig.*, pp. 927-930, Dec. 2002.

*Primary Examiner*—Lynne A Gurley
*Assistant Examiner*—Samuel A Gebremariam
(74) *Attorney, Agent, or Firm*—Scully, Scott, Murphy & Presser, P.C.; Joseph P. Abate, Esq.

(57) ABSTRACT

The present invention provides two-transistor silicon-oxide-nitride-oxide-semiconductor (2-Tr SONOS) non-volatile memory cells with randomly accessible storage locations as well as method of fabricating the same. In one embodiment, a 2-Tr SONOS cell is provided in which the select transistor is located with a trench structure having trench depth from 1 to 2 μm and the memory transistor is located on a surface of a semiconductor substrate adjoining the trench structure. In another embodiment, a 2-Tr SONOS memory cell is provided in which both the select transistor and the memory transistor are located within a trench structure having the depth mentioned above.

10 Claims, 12 Drawing Sheets

U.S. PATENT DOCUMENTS

| | | | |
|---|---|---|---|
| 6,680,230 B2 * | 1/2004 | Arai et al. | 438/258 |
| 6,787,419 B2 | 9/2004 | Chen et al. | |
| 6,842,370 B2 | 1/2005 | Forbes | |
| 6,894,339 B2 * | 5/2005 | Fan et al. | 257/314 |
| 7,118,967 B1 * | 10/2006 | Ngo et al. | 438/261 |
| 2002/0153546 A1 * | 10/2002 | Verhaar | 257/296 |
| 2002/0182786 A1 * | 12/2002 | Chien et al. | 438/149 |
| 2004/0183124 A1 | 9/2004 | Hsu | |

FOREIGN PATENT DOCUMENTS

| | | |
|---|---|---|
| EP | 1271652 A2 | 1/2003 |

* cited by examiner

METHOD OF FABRICATING HIGH-DENSITY, TRENCH-BASED NON-VOLATILE RANDOM ACCESS SONOS MEMORY CELLS FOR SOC APPLICATIONS

RELATED APPLICATIONS

This is a divisional application of U.S. patent application Ser. No. 10/907,686 filed on Apr. 12, 2005.

FIELD OF THE INVENTION

The present invention relates to semiconductor memory devices and methods of fabricating the same. More particularly, the present invention relates to two-transistor (2-Tr) semiconductor-oxide-nitride-oxide-semiconductor (SONOS) trench memory cells with randomly accessible storage locations and methods of fabricating the same. The present invention provides 2-Tr SONOS trench memory cells wherein the select gate is located in a trench structure and the memory gate is located on a surface of a semiconductor substrate or wherein both the select gate and the memory gate are located in a trench structure.

BACKGROUND OF THE INVENTION

Conventional flash memory products employing floating gate technologies, where the memory state is represented by the charge stored in an insulated, but conducting layer between the control gate electrode and the device channel region, typically use programming voltages (i.e., writing and erasing) of 10V or higher. Because of the necessity of providing high voltage levels for floating gate memory operation, integration of floating gate memories with complementary metal oxide semiconductor (CMOS) is problematic. First, present CMOS power supplies ($V_{dd}$) are approaching 1V. At these low supply voltages, it is difficult to provide high voltage levels necessary for floating gate operation—even with the use of charge-pumping circuits. Presently, one is forced to provide a separate high voltage supply for floating gate memories, e.g., 3.3V, and the use of charge-pumping circuitry, in addition to a lower voltage supply source for any CMOS logic associated with the chip. For mobile applications, the high supply voltages necessary for conventional floating gate memories severely limit the battery life. Moreover, there is a severe cost penalty of integrating floating gate memories with CMOS—it is estimated that as many as nine (9) additional lithography steps may be necessary.

Randomly-accessible semiconductor-oxide-nitride-oxide-semiconductor (SONOS) (also referred to as metal-oxide-nitride-oxide-semiconductor (MONOS); note that the terms SONOS and MONOS denote basically the same type of memory cell except that polysilicon is used as the SONOS gate conductor and a metal is used as the MONOS gate conductor) memory is considered a viable replacement to floating gate memories due to the moderate operating voltages these memories employ, e.g., approximately 5V. In such memory cells, the memory state is represented by the charge stored in an insulator layer located between the control gate electrode and the device channel region. Depending on the programming conditions of the memory cells, it may be possible, for example, to lower the high voltage supply from 3.3V to 1.8V or even do away with the separate power supply altogether, thereby prolonging battery life. In addition, since SONOS memories typically utilize uniform tunneling for programming, reliability problems usually associated with floating gate memories, such as hot hole injection, are avoided.

However, SONOS cells are not immune to scaling concerns. The moderate voltages needed for programming put limits on the transistor design one can employ. Short-channel effects, including punch-through, can easily occur even at these voltages, if the device channel lengths are too short. Increasing channel doping concentrations to deter punch-through can lead to lower junction breakdown and destruction of any memory capability.

The scaling of SONOS memory cells has been limited to planar devices. The select gate and memory gate are typically formed separately and the cell sizes of these types of cells are usually large. Recently, a SONOS planar bit cell with a 0.157 $\mu m^2$ cell size designed in 90 nm groundrules has been reported. See, for example, C. T. Swift, G. L. Chindalore, K. Harber, T. S. Harp, A. Hoefler, C. M. Hong, P. A. Ingersoll, C. B. Li, E. J. Prinz, J. A. Yater; "An embedded 90 nm SONOS nonvolatile memory utilizing hot electron programming and uniform tunnel erase" IEDM Tech. Dig., pp. 927-930, December 2002. Although smaller in size, the planar cell has its limits as the channel length may be more difficult to scale in the forthcoming generations. In addition, the planar ONO memory gate must be constructed separately from any CMOS gate process. Additional four (4) masks are required above and beyond the CMOS process to create the prior art SONOS cell array. Due to the necessity of separating the SONOS memory gate to CMOS processing, integration with high-performance CMOS can become costly.

In view of the above, there is still a need for providing methods for forming high density SONOS memory cells that can be randomly accessed and programmed at lower voltages than prior art non-volatile memory cells.

SUMMARY OF THE INVENTION

The present invention provides non-volatile memory cells, i.e., SONOS memory cells, whose area is less than prior art cells employing planar CMOS transistors. The present invention also provides non-volatile SONOS memory cells that can be programmed at lower voltages than prior art cells. The present invention further provides non-volatile SONOS memory cells whose fabrication process is compatible with industry standard CMOS processes. The present invention even farther provides SONOS memory cells that are an improvement over prior art SONOS and floating gate NVRAM cells.

Specifically, the present invention provides two-transistor (2-Tr) SONOS memory cells with randomly accessible storage locations. In one embodiment, the memory transistor is a planar device located on a surface of a semiconductor substrate, while the select transistor is located within a trench structure that is present in the semiconductor substrate. In this embodiment of the present invention, a "shallow" trench structure (on the order of from about 1 to about 2 $\mu m$ in depth) is used to serve as the select gate—or in other words—the cell's access field effect transistor (FET) lies along the vertical sidewall of a trench structure. Short-channel behavior of the select gate can be prevented as the trench depth, which determines the channel length of the cell, can be made larger without affecting the areal density of the cell. Because the select MOSFET is formed along the sidewall of a trench, its channel length is not constrained to scale with decreasing minimum feature size of successive technology nodes; however, the trench cross-section dimensions can easily scale with the minimum feature size of the technology node, thus avoiding area penalty. It has been estimated that a 2-Tr SONOS cell designed in a 65 nm logic library could be on the order of 0.15 µm²—this would be approximately 5× smaller than any 2-Tr memory cell that is currently in the marketplace.

Additional benefits that are provided in the first embodiment of the present invention include: (1) the operation of the memory cell uses voltages that are half that of present-day flash memories, which should provide higher margin for oxide reliability of memory cells, (2) inherently superior read, e.g., disturb characteristics, compared to 1-Tr NORs—as the memory FET is not biased during a read operation. Moreover, the number of additional masks needed to integrate the SONOS trench cells into CMOS is estimated to be a maximum of 4.

The trench structure is the key enabler in providing these much-reduced 2-Tr SONOS cell sizes. However, unlike the trench structures in embedded dynamic random access memory (eDRAM) technology, the depth for the trench structure of the present invention is much shallower. The depth of the trench structure would only need to accommodate a channel length that would minimize detrimental short-channel effects; it is estimated that trench depths of about 0.5 µm to about 1.0 µm would be sufficient for this purpose.

A second unique feature of the inventive cells is the manner in which the select gate is contacted. In order to keep the cell compact, a metal contact is placed directly on the trench structure and is used to contact the (trench) gate. A third feature unique to the present invention is the source-side diffusion for the trench. Here, the source of the trench select gate is placed at the very bottom of the trench structure and is contacted by a deep N-band implant (this is commonly referred to as a "common buried source"). Source control is provided at the edges of the array through an N-diffusion guard ring that surrounds the array and very much resembles the N-diffusion guard ring that surrounds an eDRAM array (to make contact to the buried plate).

Specifically, and in broad terms, the first embodiment of the present invention provides a non-volatile random access memory cell that comprises:

a semiconductor substrate including at least one array region that contains a plurality of trench structures having a depth from about 1 to about 2 µm, each trench structure including a select transistor having a channel located on vertical sidewalls of said trench structure, wherein selected trench structures are isolated by a trench isolation region;

a source diffusion located beneath a bottom wall of each trench structure; and a memory transistor comprising an oxide/nitride/oxide gate dielectric located on a surface of said semiconductor substrate and adjoining said selected trench structures.

In addition to the 2-Tr SONOS memory cell structure described above, the present invention also provides a method of fabricating the same. In broad terms, the method used in forming the non-volatile random access memory cell described above comprises:

forming a plurality of trench structures into an array region of a semiconductor substrate, wherein each trench structure has a depth from about 1 to about 2 µm;

forming a source diffusion beneath each trench structure and forming a vertical select channel along sidewalls of each trench structure;

forming a select gate transistor within each trench structure;

providing a trench isolation region between selected trench structures; and forming a memory transistor including an oxide/nitride/oxide gate dielectric on a surface of said semiconductor substrate, said memory transistor is adjoining said selected trench structures.

In a second embodiment of the present invention, the memory transistor and the select gate transistor are both located within a trench structure that is formed into a semiconductor substrate. In this embodiment, a SONOS memory trench memory cell is provided that can be scaled to approximately ½ the current SONOS cell sizes in the 65 nm logic generation and only a single mask process above the CMOS process is used. Essentially, the SONOS trench memory cell described in the second embodiment decouples the standard CMOS process from the processing of the non-volatile random access memory storage and access elements. The key enabler in this embodiment is that the select gate and the memory gate are integrated with a trench structure. The trench structure typically has a depth, as measured from the top surface of the semiconductor substrate to the bottom trench wall, from about 1 to about 2 µm. The relatively shallow trench depth (as compared to 8 µm depths of DRAM storage capacitors) easily accommodates both the select and memory transistors which are relatively immune from short channel effects that challenge the CMOS logic devices. Here, the select gate is grown in a bottom portion of the trench structure and the memory transistor comprising an ONO film is formed in the upper portion of the trench structure. By allowing for the select and memory gates to be combined within a trench structure, one can shrink the cell to cell sizes of approximately 0.07-0.09 µm² in the 65 nm logic technology. In addition, both the trench SONOS select gate and the memory gate formation can be fully decoupled from normal CMOS processing—no special block masks are needed to create different gate dielectrics and one could fully optimize memory cell functionality without compromising logic performance. The implementation of a trench SONOS cell into a CMOS logic technology would only add one mask to the base logic process.

Specifically, and in broad terms, the second embodiment of the present invention provides a non-volatile random access memory cell that comprises:

a semiconductor substrate including at least one array region that contains a plurality of trench structures having a depth from about 1 to about 2 µm, each trench structure including a lower portion comprising a select transistor having a channel located on vertical sidewalls of said trench structure, and an upper portion comprising a memory transistor including an oxide/nitride/oxide gate dielectric;

a trench isolation region located between selected trench structures; and a source diffusion located beneath a bottom wall of each trench structure.

In addition to the 2-Tr SONOS memory cell structure described above, the present invention also provides a method of fabricating the same. In broad terms, the method used in forming the memory cell structure described above comprises:

forming a plurality of trench structures into an array region of a semiconductor substrate, wherein each trench structure has a depth from about 1 to about 2 µm;

forming a source diffusion beneath each trench structure and forming a vertical select channel along sidewalls of each trench structure;

forming a select transistor within a lower portion of each trench structure;

forming a memory transistor including an oxide/nitride/oxide gate dielectric within an upper portion of each trench structure; and forming a trench isolation region between selected trench structures.

DETAILED DESCRIPTION OF THE INVENTION

Figure 1:
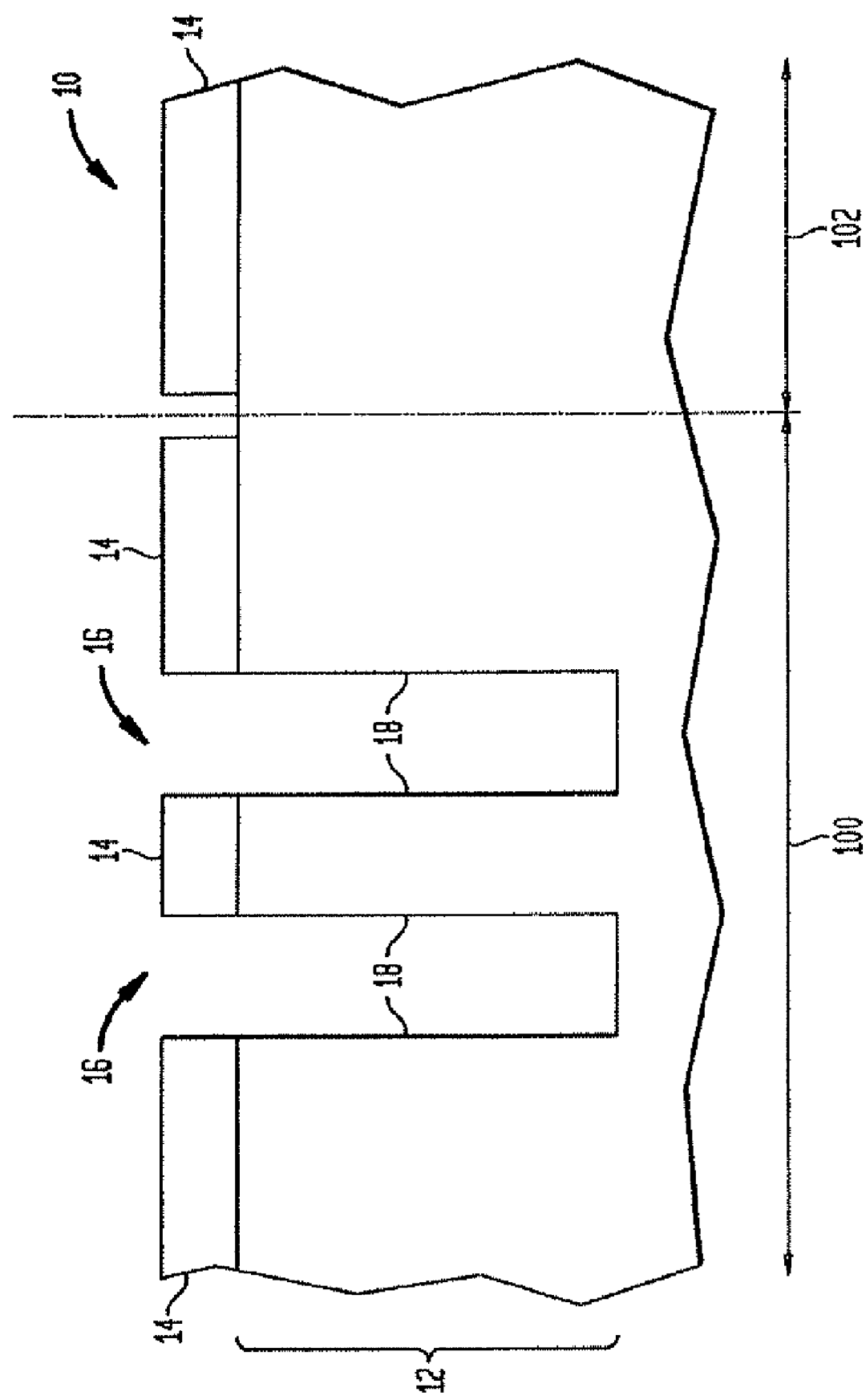
FIGS. 1-6 are pictorial representations (through cross sectional views) illustrating the basic processing steps used in a first embodiment of the present invention for fabricating the inventive 2-Tr SONOS memory cell. In the first embodiment, the select gate is located within a trench structure and the memory gate is located on a surface of a semiconductor substrate that includes said trench.

The present invention, which provides 2-Tr SONOS memory cells with randomly accessible storage locations and methods of fabricating the same, will now be described in greater detail by referring to the drawings that accompany the present application. It is noted that the drawings of the present application are provided for illustrative purposes and thus the same are not drawn to scale.

First Embodiment: 2-TR SONOS memory cell wherein the select gate is located within a trench structure and the memory gate is located on a surface of a semiconductor substrate including the trench structure.

The first embodiment of fabricating the inventive 2-Tr SONOS memory cell begins with providing a structure 10 such as shown in FIG. 1 which includes at least one array region 100 and at least one region 102 that lies to the periphery of the at least one array region 100. Region 102 is referred to herein as an array periphery. The structure 10 shown in FIG. 1 comprises a semiconductor substrate 12 including a pad stack 14 having a plurality of openings 16 on top of the substrate 12 in the array region 100. In the array region 100, the structure 10 also includes trench structures 18 that are located in the semiconductor substrate 12. It is noted that the semiconductor substrate 12 in the periphery array region 102 is protected with a blanket layer of the pad stack 14.

The semiconductor substrate 12 shown in FIG. 1 comprises any conventional semiconductor material including, for example Si, SiC, SiGe, SiGeC, Ge alloys, GaAs, InAs, InP as well as other III/V or II/VI compounds semiconductors. The semiconductor substrate 12 may also comprise a layered semiconductor such as, for example, a silicon-on-insulator or a SiGe-on-insulator. Typically, the semiconductor substrate 12 is a Si-containing semiconductor such as Si, SiGe, SiC, SiGeC, a silicon-on-insulator or a SiGe-on-insulator.

The pad stack 14 is comprised of at least two material layers including a bottom pad oxide layer and an upper nitride pad layer. The individual layers of the pad stack 14 are not shown in the drawings of the present invention. The thickness of the pad stack 14 may vary depending on the number of material layers within the stack. Typically, the overall thickness for a pad stack 14 including a pad oxide and a pad nitride is from about 20 to about 500 nm. In an exemplary embodiment, the pad oxide has a thickness from about 5 to about 10 nm and the pad nitride has a thickness from about 100 to about 200 nm.

The pad stack 14 is formed on the surface of the semiconductor substrate 12 using one or more conventional blanket deposition techniques such as, for example, chemical vapor deposition (CVD), plasma enhanced chemical vapor deposition (PECVD), evaporation, chemical solution deposition or atomic layer deposition. In addition to deposition processes, the various material layers of the pad stack 14 can be formed by thermal oxidation or thermal nitridation. A combination of the aforementioned techniques can also be used.

After forming the pad stack 14 on the semiconductor substrate 12 in both the array region 100 and the area periphery 102, an oxide hardmask (not shown) is then formed atop the pad stack 14 in regions 100 and 102. The oxide hardmask is formed utilizing one of the techniques described above for forming the various material layers of the pad stack 14. The thickness of the oxide hardmask may vary depending on the technique that was used to form the same. A typical thickness for the oxide hardmask is from about 20 to about 400 nm. A resist having trench openings (both of which are not shown in FIG. 1) in the array region 100 is then formed by deposition of a resist material and lithography. The lithographic step includes exposing the applied resist to a desired pattern (i.e., a trench pattern) of radiation and developing the exposed resist utilizing a conventional developer. After forming the resist having the trench openings, the pattern is first transferred to the oxide hardmask utilizing an anisotropic etching process such as reactive ion etching, ion beam etching, plasma etching or laser ablation. The resist can be removed after the trench pattern has been transferred to the oxide hardmask or it can remain on the structure during the transfer of the pattern from the hardmask to the pad stack 14 and then to the semiconductor substrate 12 and thereafter removed, as described above. These later pattern transfer steps can be performed utilizing the same etching process as described above. A plurality of trench structure 18 (two of which are shown in FIG. 1) having a depth, as measured from the upper surface of the semiconductor substrate 12, from about 1 to about 2 µm, are formed into the semiconductor substrate 12 in the array region 100.

After the trench structures 18 have been formed in the array region 100, and if not previously removed, the oxide hardmask used to define the trench structures 18 is removed utilizing a conventional stripping process that selectively removes oxide, stopping on the nitride surface of the pad stack 14.

Figure 2:
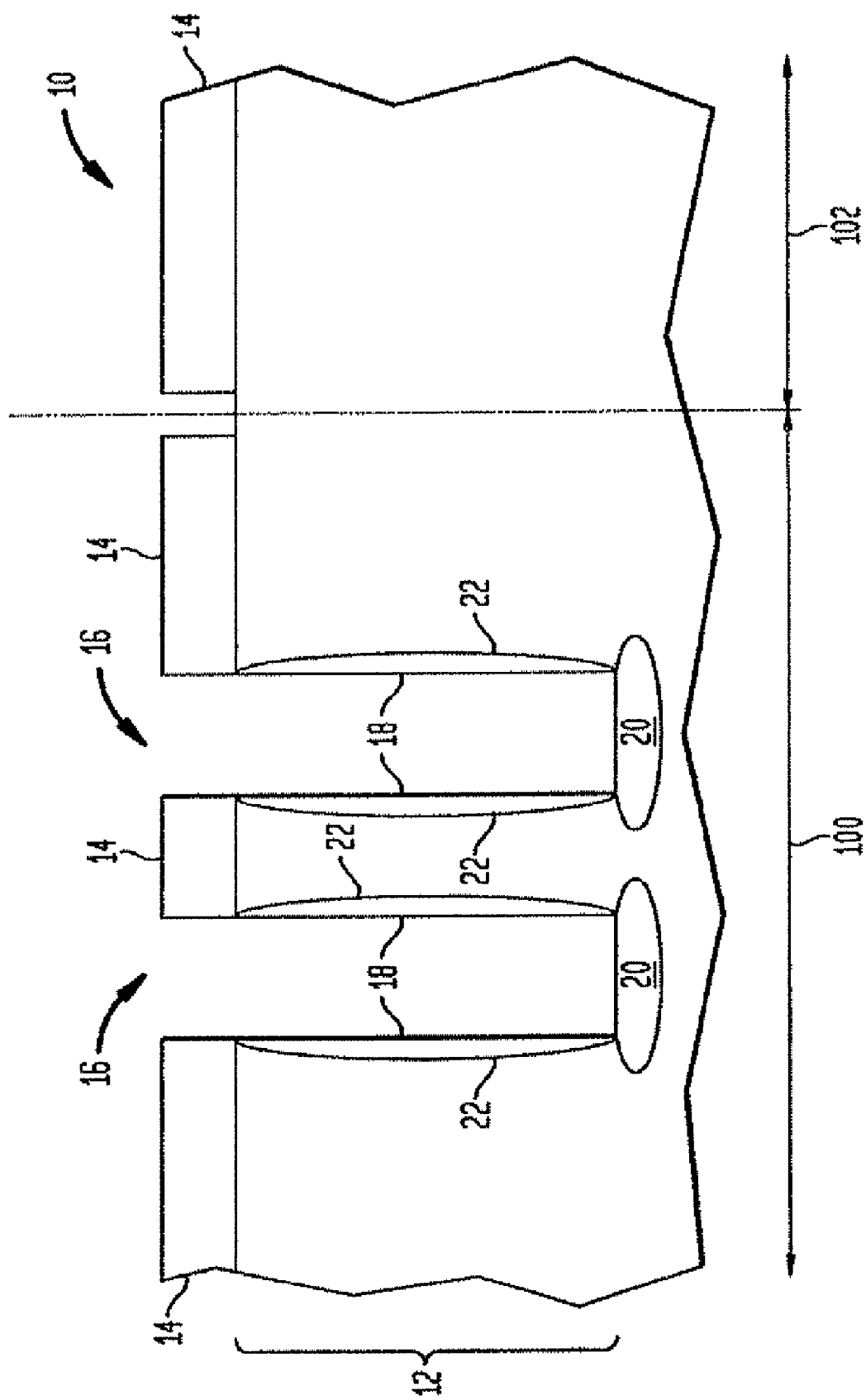

Next, the cell's source diffusion 20 and select gate channel 22 can be formed by ion implantation processes. The structure after these two implants have been performed is shown in FIG. 2. As shown, the source diffusion 20 is formed in the semiconductor substrate 12 about the exterior bottom wall of the trench structure 18, while the select gate channel 22 is formed into the semiconductor substrate 12 about the exterior sidewalls of each trench structure 18.

The order of the implants used in forming the source diffusion 20 and the select gate channel 22 is not critical to the present invention. Typically, however, the source diffusion implant occurs prior to the select channel implant.

The source diffusion 20 may be doped with an n-type dopant atom (i.e., an element from Group VB of the Periodic Table of Elements, such as, for example, P, Sb or As) or a p-type dopant atom (such as an element from Group IIIB of the Periodic Table Elements, such as, for example, In, B or $BF_2$). Typically, n-type dopants are used in forming the source diffusion 20. The implant energies used in forming the source diffusion 20 is typically from about 10 to about 40 keV and ion doses from about 1E15 to about 5E15 atoms/cm² are typically used to form a heavily doped source diffusion 20. Optionally, the sidewalls of the trench structure 18 may be protected by a masking layer, such as a nitride spacer, during the implantation of the source diffusion 20. Since the dopant concentration of the source diffusion 20 is much larger than that of the select gate channel 22, the sidewalls may need to be protected to avoid contamination of the channel by the source implant. The protective spacers are removed prior to implantation of the select gate channel 22.

The select gate channel 22 has a polarity that is opposite to that of the source diffusion 20. Typically, the selected gate channel 22 is doped with a p-type dopant. The select gate channel implantation is performed utilizing an angle implantation process in which a tilt angle from normal incident of about 5° to about 10° is typically employed. The channel doping required for the select gate channel 22 is dependent on the thickness of the gate dielectric to be subsequently formed in the trench structure 18. An ion dose from about 1E13 to about 1E15 atoms/cm² is typically used for providing a range of threshold voltages (Vt) of about 0.3 to about 1.5V for a 10-15 nm gate dielectric.

Alternatively, an array doping process could be used to set the Vt of the select gate device. Typically, in standard bulk logic technologies, a triple well is usually created to define P-wells. These wells consist of a deep implant (250 to 350 keV), a medium implant (of about 150 keV) and a shallow implant (of about 50 keV).

Figure 3:
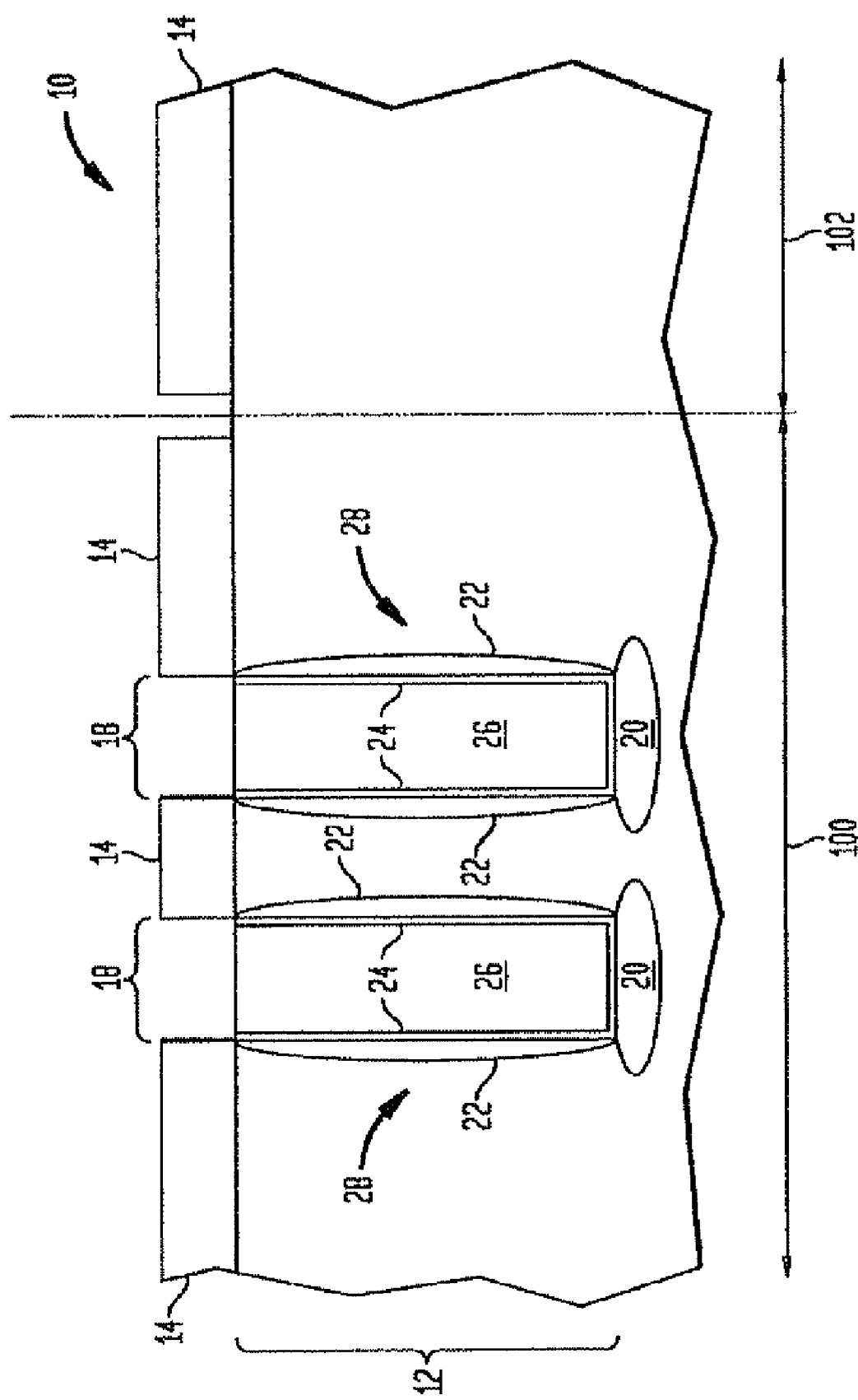

After the implantation processes, a select gate dielectric 24 is formed along each trench structure wall (e.g., bottom wall and sidewalls) utilizing a thermal growth process such as, for example, oxidation, nitridation and/or oxynitridation. Alternatively, a conventional deposition process such as CVD or PECVD can be used. The select gate dielectric 24, which is comprised of an oxide, nitride, oxynitride or multilayers thereof, typically has a thickness from about 3 to about 15 nm. Each of the trench structures 18 is then filled with a conductive material 26 and is recessed to the level of the semiconductor surface 12 or slightly below the surface, e.g., from about 10 to about 20 nm below the surface of the semiconductor substrate 12. The resultant structure including the select gate dielectric 24 and the conductive material 26 is shown, for example, in FIG. 3. It is noted that in this drawing, reference numeral 28 is used to define the select transistor that is present in each trench structure 18. The select transistor 28 includes the vertical select gate channel 22, the select gate dielectric 24 and the conductive material 26. Region 20 forms the source of the select transistor 28 and one of the diffusions of the memory transistor (to be subsequently formed) forms the diffusion of the select transistor 28.

The conductive material 26 comprises a metal, a metal alloy, a metal silicide, polysilicon that is doped, or a combination thereof including multilayers. Preferably, the conductive material 26 is polysilicon that is doped with the same polarity as the source diffusion 20. The conductive material 26 acts as the gate of the select transistor 28. The conductive material 26 is formed utilizing a conventional deposition process. When doped polysilicon is used as the conductive material 26, it is preferred that an in-situ doping deposition process be employed. The recessing of the conductive material 26 is performed utilizing an anisotropic etching process such as reactive ion etching.

Once the select transistor 28 has been processed, trench isolation regions 30 are formed into the array region 100 and the periphery array region 102 using conventional processes well known in the art including, for example forming trenches within the substrate 12 by lithography and etching, and filling the trench with a trench dielectric such as an oxide. Note that typically the depth of the trenches used in forming the isolation trenches is shallower than the trench structure 18 including the select transistor 28. In the drawing, the trench isolation region 30 in the array region 100 separates two selected trench structures including select transistors 28.

Figure 4:
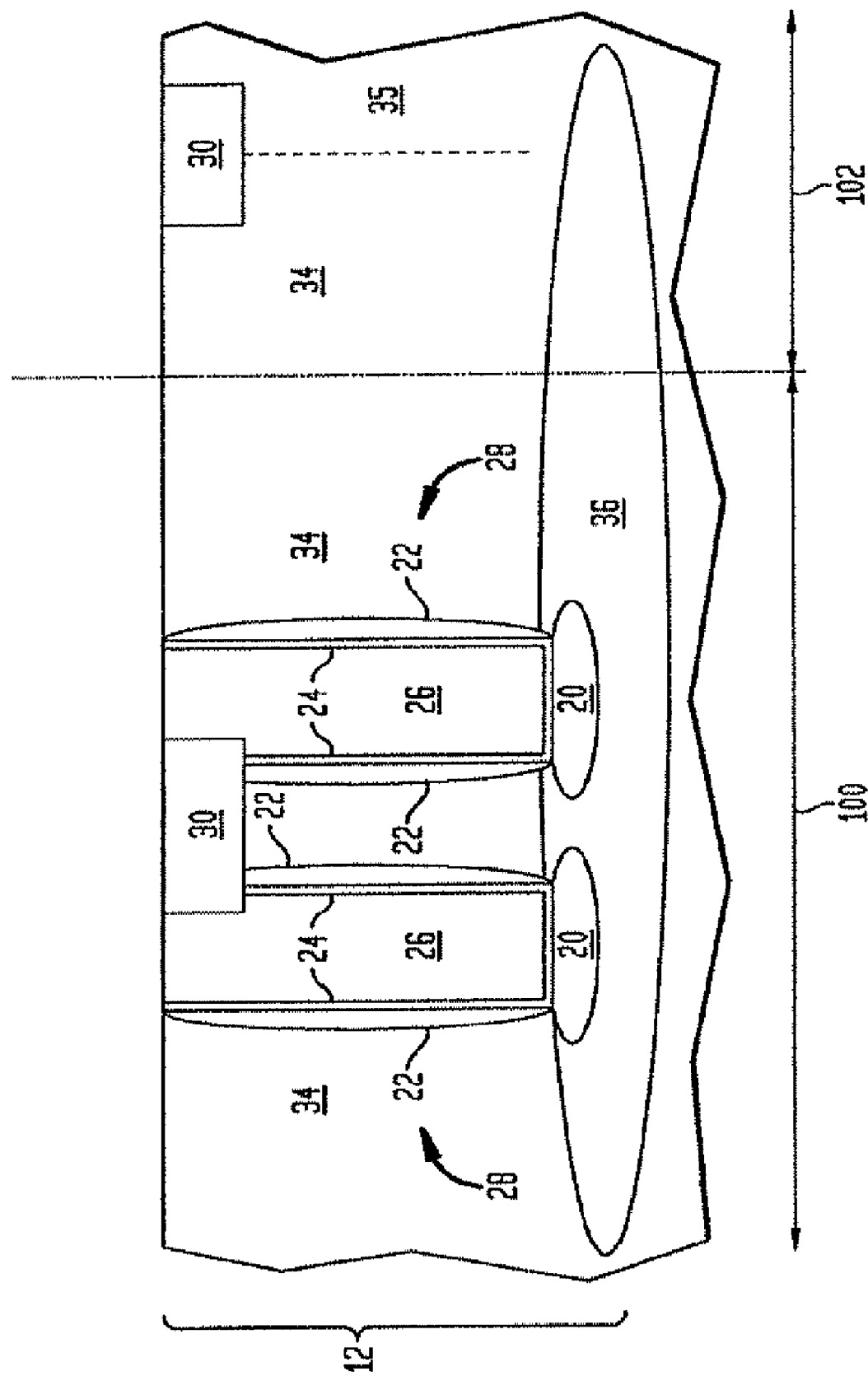

After the trench isolation regions 30 have been formed, array well 34 is created by a series of implants, such as p-type (B), implants through an opening in a resist mask (not shown in FIG. 4). The array well 34 is typically a Pwell in the embodiment illustrated. Another well region 35 of opposite conductivity to the array well 34 can be formed at this point of the inventive process in region 102.

Another mask (also not shown) is then used to implant an N-band 36 (or alternatively P-band) that connects the source diffusions 20 beneath each of the trench structures 18 including the select transistors 28. The N-band 36 (or the P-band) is typically formed using an energy of about 1 MeV and a ion dosage from about 1E13 to about 3E13 atoms/cm².

The array well 34 could also be used to set the channel doping of the trench select gate device and the doping of the memory gate. The array well 34 is biased through contacts (to be subsequently formed) that lie on a p-diffusion guard ring (to be subsequently formed) that sits outside the array. The N-band 36/source diffusions 20 are biased through contacts that lie on an n-diffusion guard ring (to be subsequently formed) that sits adjacent to the p-diffusion guard ring. The array well 34 is the only additional well mask in the present invention that is necessary to set the SONOS cell device elements.

After other CMOS wells 35 have been processed (to set the channel doping for CMOS devices), a protective layer of silicon nitride is deposited and patterned with a non-critical block mask (a third unique mask) to expose the array area 100, and to protect the periphery 102. The memory transistor's gate dielectric 38 comprising an oxide-nitride-oxide (ONO) dielectric stack is then created. See, FIG. 5. The ONO dielectric stack 38 typically consists of a bottom tunneling oxide having a thickness from about 1.2 to about 3, preferably about 2, nm, a nitride layer having a thickness from about 5 to about 15, preferably about 7.5, nm, and a top oxide having a thickness from about 2.5 to about 7.5, preferably about 5, nm. The bottom tunneling oxide can be formed utilizing a conventional deposition process such as CVD or PECVD or a thermal oxidation process can be used. The nitride layer of the dielectric stack 38 is typically formed by a deposition process such, for example, PECVD or low pressure chemical vapor deposition (LPCVD) process. The top oxide is typically formed by a deposition process including, for example, CVD or PECVD.

Next, a gate conductor 40 including a metal, metal alloy, metal silicide, polysilicon or multilayers thereof is formed atop the ONO dielectric stack in array region 100 utilizing a conventional deposition process and patterned. See, the structure shown in FIG. 5. It is noted that the gate conductor 40 is the gate of the memory transistor which is labeled by reference numeral 42 in the drawing.

With the memory transistor gates 40 having been formed, it is necessary to remove the exposed ONO 38 and remaining regions of protective nitride from the periphery 102. This can be achieved with the application of a non-critical block mask, or with a maskless selective etch process if no other regions of nitride are present. If a masked process is used, a resist mask is provided that opens all CMOS areas and allows either wet or dry etch chemistries to remove the ONO and underlying protective nitride layer, selective to the substrate 12. The resist is then removed. Having cleared the array periphery 102, gate dielectric for the CMOS logic transistors is formed, followed by deposition and patterning of gate conductor, using standard well known processes.

A dielectric cap (not shown) may optionally have been formed atop the gate conductor 40 and the logic gates in the array periphery 102. A sidewall spacer 44 is then formed on the sidewalls of the gate conductors by deposition and etching. Following theses processes, one typically proceeds with implant masks that allow for creation of CMOS nFET and pFET diffusions (including extensions) 46. Since the SONOS memory transistor 42 is likely to be a device that operates under higher voltages than the accompanying CMOS, a separate array extension mask would likely be necessary to separately dope the diffusion regions of the memory gate—this would be the fourth unique, and final, mask to include into the CMOS mask suite.

Figure 5:
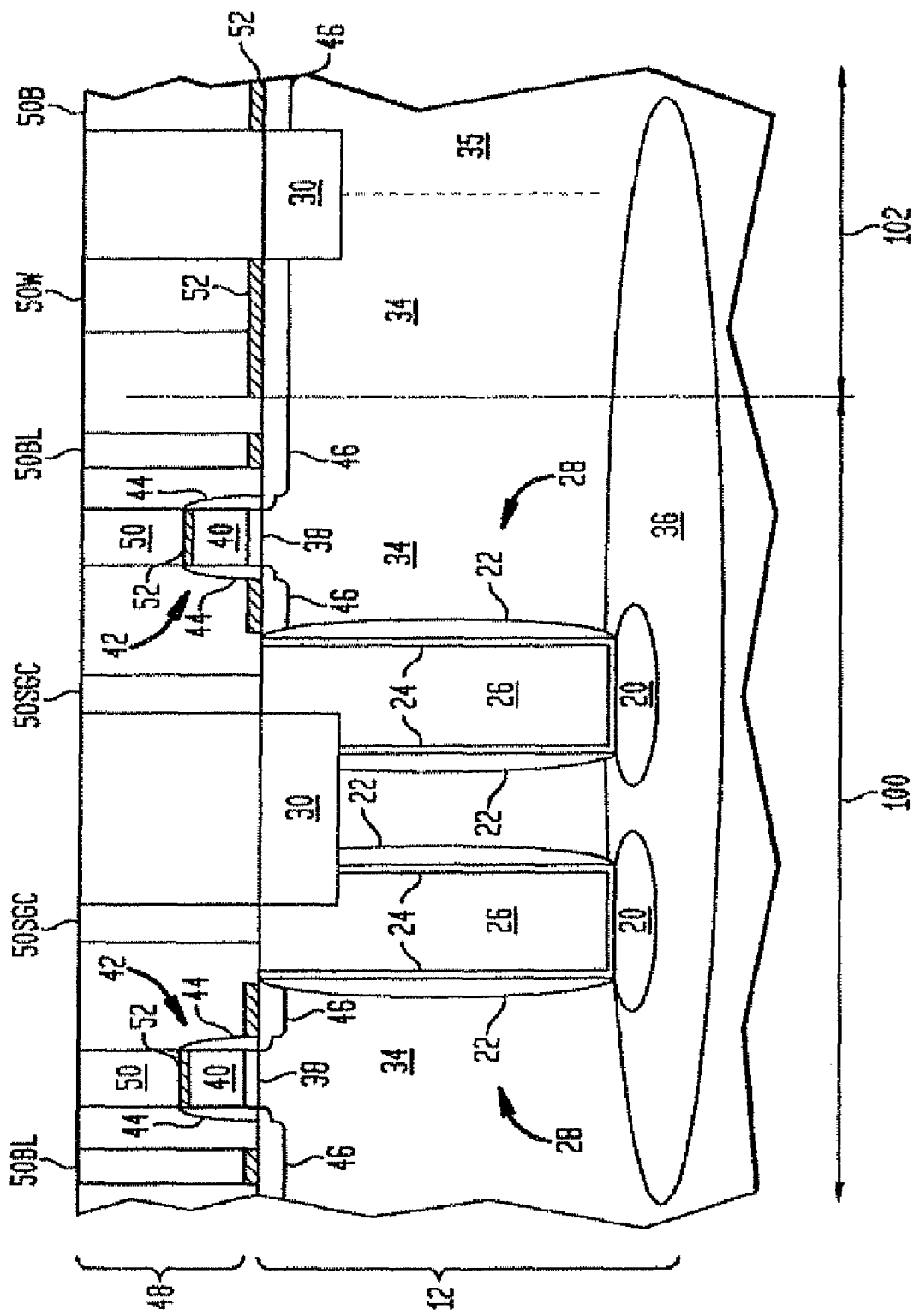

After the memory and CMOS diffusions have been created, the subsequent processes should follow the standard CMOS logic process including, for example, formation of an intra-level dielectric 48, providing contact openings in the intra-level dielectric 48, and filling the contact openings with a conductive material 50 such as, for example, W or Cu. Prior to filling the opening with a conductive material 50, the exposed surfaces can be silicided utilizing a conventional silicidation process. In FIG. 5, the silicide regions are labeled by reference numeral 52. In embodiments, in which dielectric cap is not present atop the gate conductor 40, a silicide can be formed atop the gate conductor 40 if the conductor 40 is comprised of polysilicon.

It is noted that in FIG. 5, reference numeral 50BL denotes the bitline contact, reference numeral 50SGC denotes the select gate contact, reference numeral 50W denotes the well contact and reference numeral 50B denotes the N-band (or P-band) contact.

Figure 6:
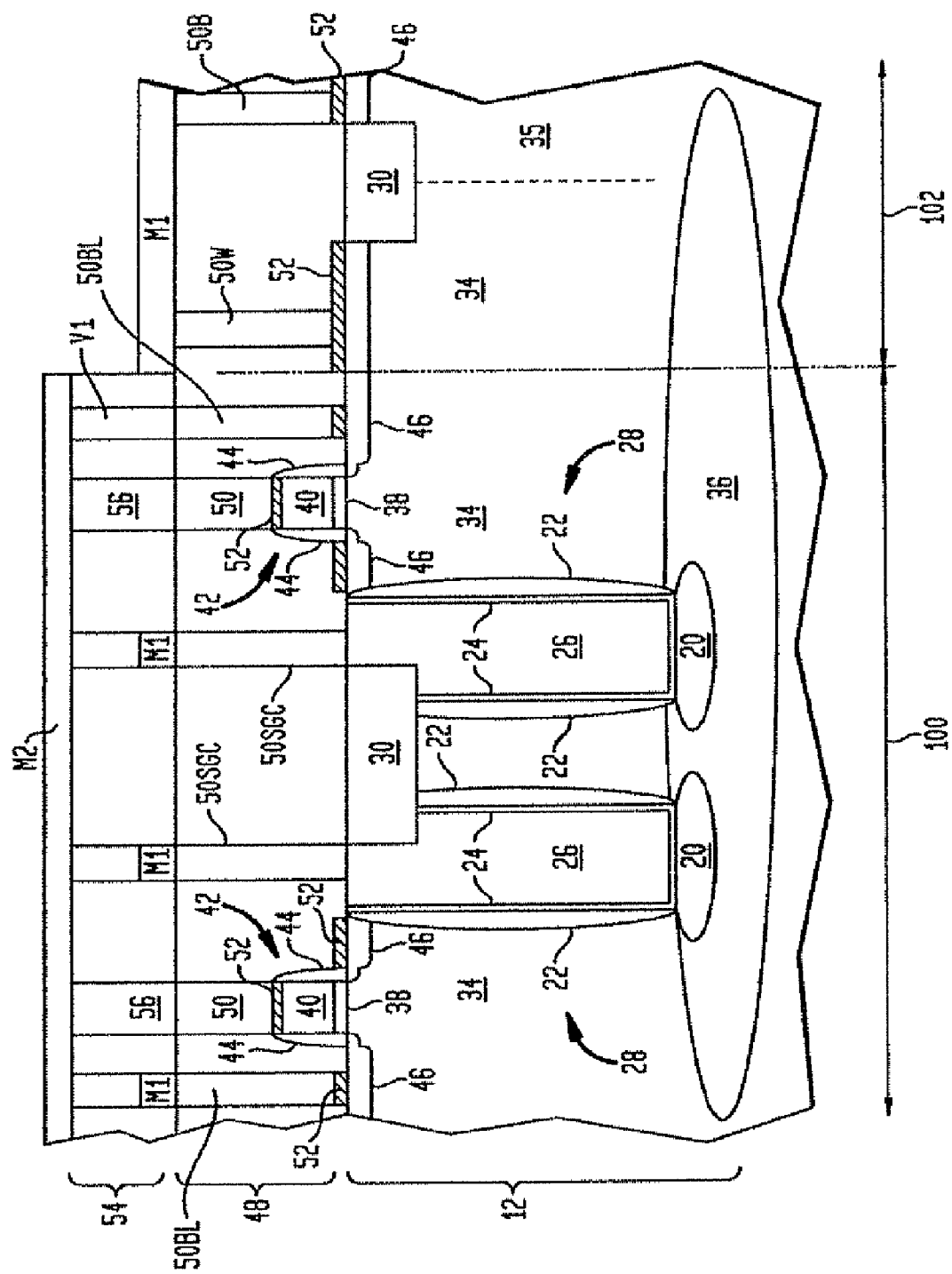

One unique feature of this cell is that the trench select gate is contacted by a metal contact, e.g., conductive material 50. The memory gate contact 50 is exactly the same as the bitline contact 50BL and is processed simultaneously with the bitline contact 50BL. Two metal wiring M1 and M2 levels, as shown in FIG. 6, are necessary to complete the creation of the SONOS memory array. Here, the memory gate is wired on the first metal level and the bitline is wired on the second metal level. The resultant structure is shown, for example, in FIG. 6. The M1 and M2 levels are formed utilizing conventional processes well known in the art. In the drawings, V1 refers to the conductively filled via between M2 and the BL contact 50BL. Reference numeral 54 denotes dielectric material and 56 denotes conductive material.

Figure 7:
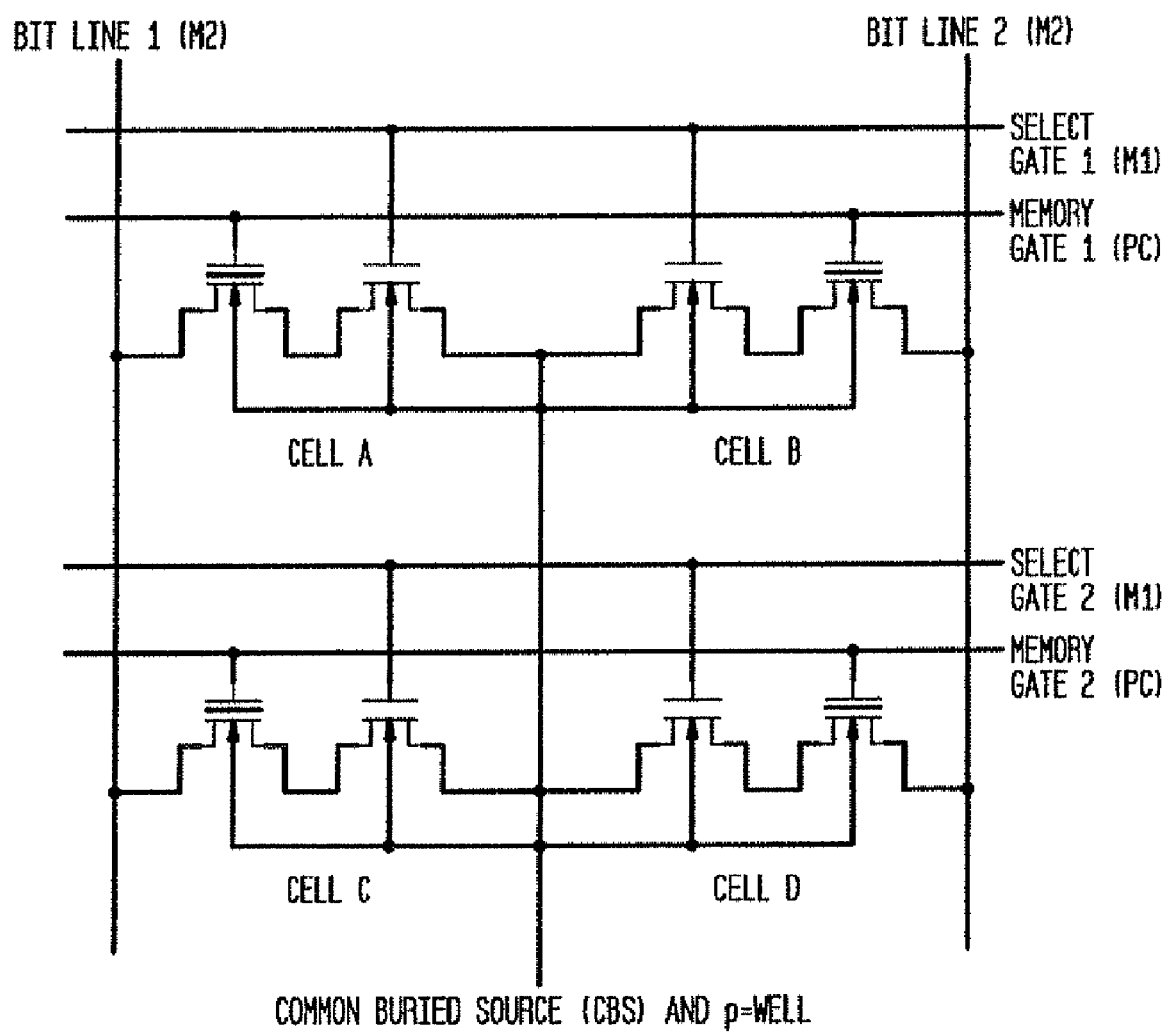
FIG. 7 is a schematic showing a proposed cell array including Cells A-D which are each comprised of the inventive 2-Tr SONOS cells provided by the processing steps shown in FIGS. 1-6.

Electrical operations that may be performed on individual memory cells in the memory array of the present invention will now be described. The basic programming operations of a SONOS cell are a) Write "0", b) Write "1"/Erase "0", c) Read "1" or Read "0". These operations will now be described by referring to FIG. 7 which is a schematic showing a proposed SONOS cell array including Cells A-D which are representative of the 2-Tr SONOS memory cells described above.

a) Write "0": In this operation it is desired to write a "0" into Cell A. The bitline (Bit Line #1) attached to Cell A is biased at −5V, and its select gate 1 is boosted to −5V. The select transistor is in the off condition, thus minimizing bitline loading. The memory gate of Cell A (Memory Gate Line #1) is boosted to +5V and the array Pwell and Nband (source) are biased to −5V. With these conditions, electrons are driven by the high field between the bitline diffusion and the memory gate, and trapped in the ONO of the memory cell. With electron injection into the ONO, the Vt of the memory device should increase considerably and should prevent current flow when being read. Note that biasing the array well (Pwell) to −5V assures that no diffusion is forward biased, in addition to avoiding hole trapping in the ONO of inhibit cell D. Inhibit cells (B, C, and D) are all biased to minimized carrier trapping and/or de-trapping in the ONO dielectric: Bit Line #2 at +5V, Memory Gate Line #2 at −5V. Since the bitline and memory gate of inhibit Cells B and C are at the same voltage (+5V for B, −5V for C), they experience negligible electric field between gate and bitline diffusion, and no transfer of charge carriers to or from the ONO. The ONO of Cell D undergoes negligible loss of trapped electrons since the field between its memory gate and bitline diffusion is diminished by the presence of a large depletion region within the bitline diffusion (resulting from the biasing polarity on cell D: Bit Line #2 at +5V, Memory Gate Line #2 at −5V). Furthermore, the −5V Pwell bias assures that the surface of the silicon between source and drain of the memory transistor of cell D has a low hole concentration, avoiding trapping of holes in its ONO.

b) Write "1" (or Erase "0"): To write a "1") into cell A, the BL is biased at +5V and the select gate is boosted again to −5V; once again the select transistor is off. The memory gate is boosted to −5V and the array Pwell and Nband (source) are biased to +5V. With these biasing conditions in the selected cells, hole injection into the ONO from the accumulated surface of the silicon between source and drain of the memory transistor is dominant. All cells sharing the same Memory Gate Select Line (e.g. Memory Gate Line #1) undergo the write "1"/erase operation, since all bitlines are at +5V. Once all cells on the same Memory Gate Line are written "1"/erase, write "0" is performed selectively to produce the desired bit pattern. Since the array Pwell and memory gate (Memory Gate Line #2) of the inhibit cells (C and D) are biased at +5V, relatively little band bending occurs in the semiconductor under the memory gate. This assures that the field in the inhibit cells is too weak to alter their charge state.

c) Read: To read a "1" or "0" from cell A, the BL is biased at a lower voltage (e.g. 1.5V) and the select gate is boosted to +5V. The memory gate, array well, and Nband (source) are grounded. For non-addressed (inhibit) cells, the bitline is floating and/or the select gate is zero, thus decoupling them from the bitline during the read operation. If a small bitline current is detected, this means that the Vt of the memory device is relatively high, causing it to only weakly conduct, hence, a "0" (trapped electrons) has been written into the cell. If a relatively large current is detected, this means that the Vt of the memory device is negative (due to trapped holes in the ONO) and the device is on; therefore a "1" has been written into the cell (i.e. a depletion mode planar memory device).

Second Embodiment: 2-Tr SONOS wherein the select gate and the memory gate are both located within a trench structure that is formed into a semiconductor substrate.

This second embodiment of the present invention offers the following advantages: (1) The trench structure memory gate can be created prior to CMOS processing and can be truly integrated into CMOS processing. The ONO dielectric comes before the CMOS process and can be optimized without degrading the CMOS device. (2) The trench structure memory select gate is structurally shallower than prior art eDRAM trenches (1-2 μm tops) and it can be formed using simplified processing, e.g., oxidation for the select gate, resist recess process, ONO formation and a one trench process (fill, planarization and recessing). (3) Extremely small cell sizes can be achieved (on the order of about 0.07 to 0.09 μm$^2$.

The second embodiment of the present invention begins by utilizing the processing steps described above in forming the structure shown in FIG. 2. In this embodiment, only array region 100 will be shown. Next, a select gate dielectric 24 is formed along each wall of the trench structure 18 (sidewalls and bottom wall) utilizing a thermal growth process such as described above in connection with the first embodiment of the present invention. The select gate dielectric 24 is comprised of one of the insulating materials described above and the thickness of the select gate dielectric 24 is within the ranges described in the first embodiment. The select gate dielectric 24 is shown, for example, in FIG. 8. After forming the select gate dielectric 24, a resist (not shown in the drawings) is formed within the trench structure 18 and the resist is recessed from an upper portion 18u of the trench structure (below approximately 0.5 μm from the upper surface of semiconductor substrate 12) exposing the select gate dielectric 24 in the upper portion 18u of each trench structure 18. The resist is formed utilizing a conventional deposition process and the recessing process comprises a timed reactive ion etching process that selectively removes a predetermined portion of the resist material. Next, and with the recessed resist present in each trench structure 18, the select gate dielectric 24 is removed from the upper portion 18u of each trench structure 18 exposing bare sidewalls (i.e., semiconductor material) of the trench structure 18. The select gate dielectric 24 is removed from the upper portion 18u of each trench structure 18 utilizing an etching process such as an isotropic dry etch that selectively removes the select gate dielectric stopping on the bare sidewalls of the trench.

Figure 8:
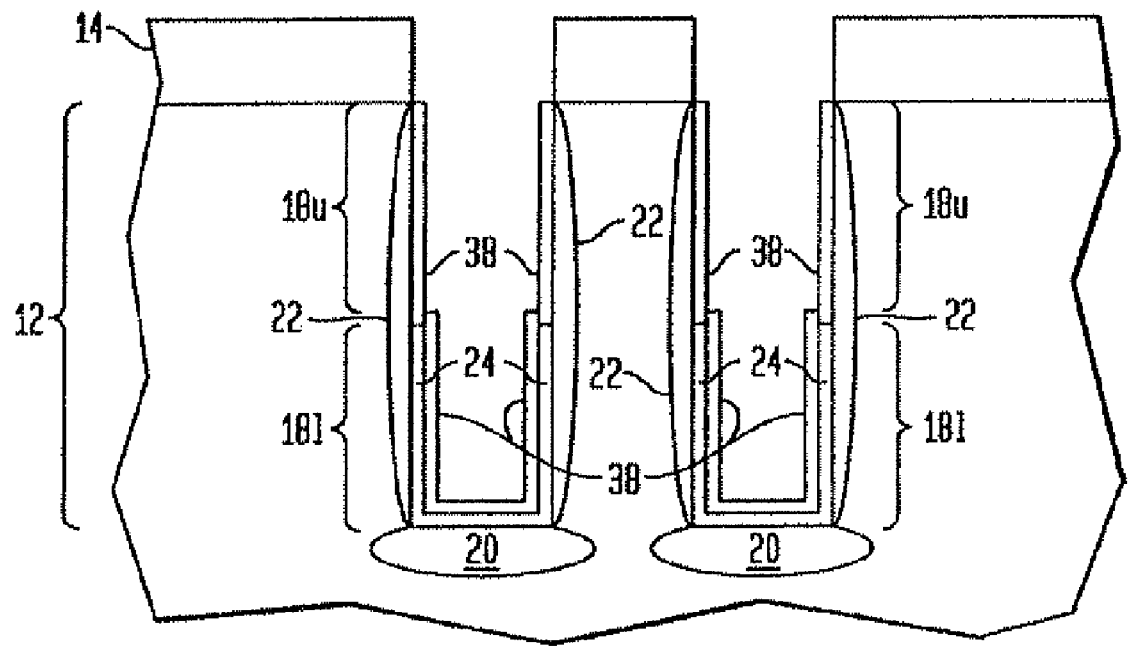
FIGS. 8-10 are pictorial representations (through cross sectional views) illustrating the basic processing steps used in a second embodiment of the present invention for fabricating the inventive 2-Tr SONOS memory cell. In the second embodiment, the select gate and the memory gate are both located within a trench structure that is formed within a semiconductor substrate.

After removing the select gate dielectric 24 from the upper portion 18u of each trench structure 18, the recessed resist is completely removed from each of the trench structures 18 by etching and thereafter an ONO dielectric stack 38 is formed within the trench providing the structure shown, for example, in FIG. 8. The ONO dielectric 38 is formed as described above in the first embodiment, and it consists of a bottom tunneling oxide, a middle nitride layer and a top oxide. The bottom tunneling oxide is position on the bare surface of the trench structure 18 sidewall (within the upper portion of each trench) and the select gate dielectric 24 in the lower portion of each trench structure 18.

Figure 9:
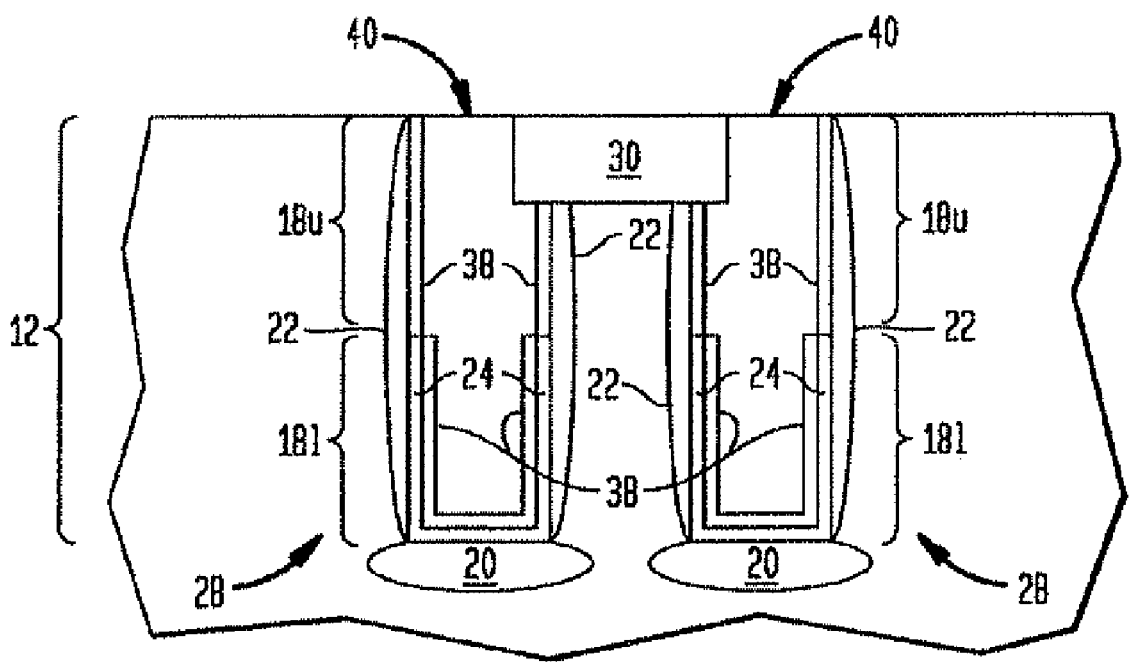

Next, and as shown in FIG. 9, each trench structure 18 is filled with a conductive material 26 such as described above in the first embodiment of the present invention. Preferably, the conductive material 26 that is formed into each trench structure 18 comprises doped polysilicon such as N+ doped polysilicon. The conductive material 26 is formed by deposition including an in-situ deposition process and a conventional planarization process such as CMP is used. Note that in this embodiment, conductive material 26 is used as the gate material for the select transistor 28 and the overlying memory transistor 42. After filling and planarization, at least one trench isolation region 30 is formed into the structure so as to isolate top portions of adjacent trench structures 18. The trench isolation region 30 is formed as described above in the first embodiment of the present invention. After forming the trench isolation region 30, the pad stack 14 located atop the semiconductor substrate 12 is stripped utilizing a conventional stripping process that selectively removes pad material 14.

Figure 10:
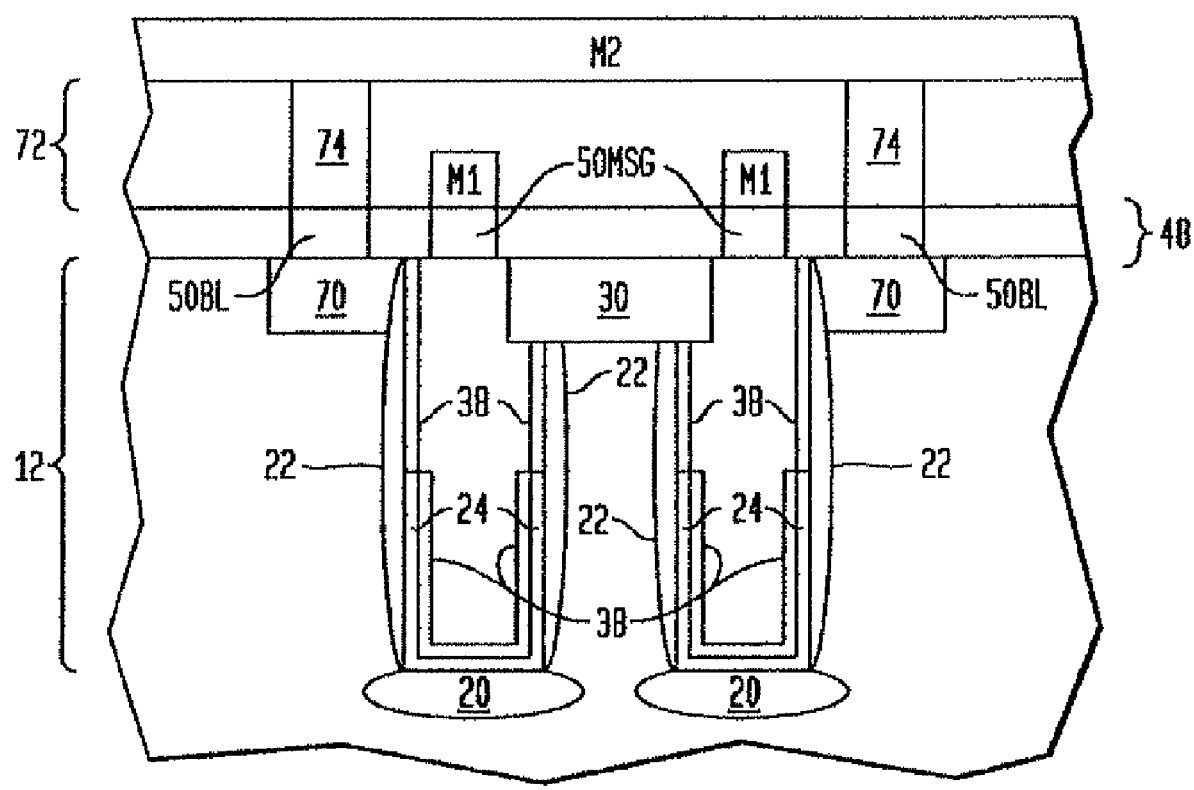

Next, and as illustrated in FIG. 10, diffusion regions 70 are formed into the semiconductor substrate 12 adjacent to each trench structure 18 utilizing a conventional ion implantation process followed by a conventional activation anneal. After forming the diffusion regions 70, an interlevel dielectric 48 having contact openings filled with a conductive material 50 is formed. The conductive material above the diffusion regions 70 is referred to as the bitline contact and thus the reference numeral 50BL is used to describe that region. The conductive material above the each trench structure 18 is referred to as the memory select gate conduct (or wordline) and thus the reference numeral 50MSG is used to describe that region. Additional dielectric materials containing conductive filled lines and vias are then formed utilizing standard interconnect technology. In FIG. 10, reference numerals 72 referred to an interlevel dielectric, reference numeral 74 refers to conductive regions, M1 is used to denote a first metal level and M2 is used to denote a second metal level.

In some instances, the select gate dielectric 24 can be removed from the bottom wall of the trench utilizing the following technique. After formation of the ONO in the trench, the array would be covered by a resist. The ONO and select gate are then reactively ion etched to open the bottom of the trench for deep trench contacts. After stripping of the resist, the array and deep trench source line contacts are simultaneously filled with conductive material 26.

Figure 11:
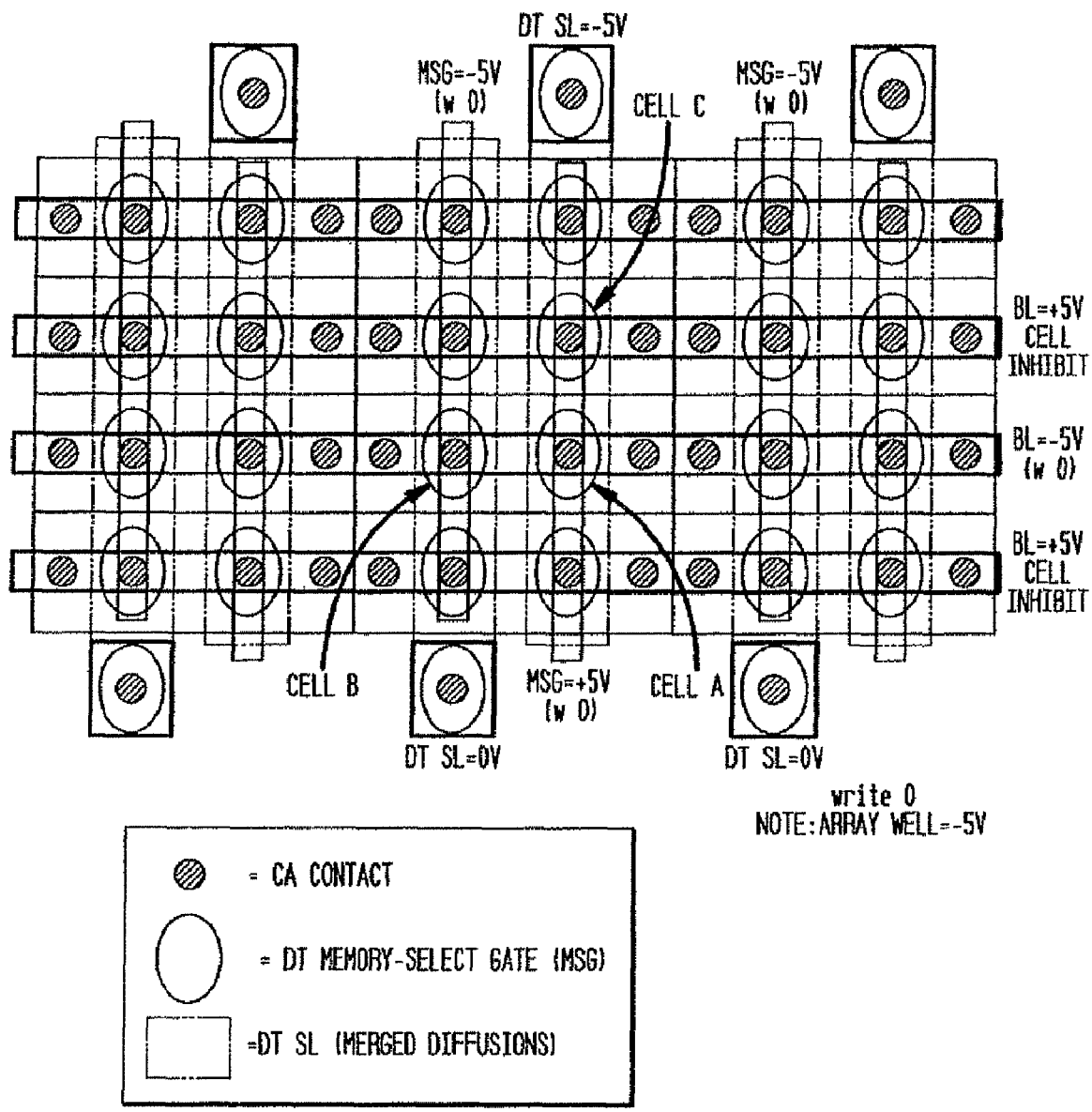
FIG. 11 is a cell array layout (top-down view) including the inventive 2-Tr SONOS memory cells shown in FIG. 10.

The structure shown in FIG. 10 and described by the second embodiment of the present invention is referred to herein as e-tunneling one trench SONOS memory cell. Note that is this embodiment, the memory select gates run parallel to DT source lines and bitlines run perpendicular to the DT source lines and the memory select gates. A possible cell layout for the cell provided by the second embodiment of the present invention is shown, for example, in FIG. 11. Cells A-C are labeled and will be described below in connection with the electrical operations.

Electrical operations that may be performed on each memory cell in an array will now be described. The basic programming operations are a) Write "0", b) Write "1"/Erase and c) Read "1" or "0".

a) Write "0": To write a "0" into Cell A shown in FIG. 11, the bitline (BL) is biased at −5V, the memory select gate (MSG) is boosted to 5V and the array Pwell is biased to −5V. With these conditions, electrons are driven by the high field between the inversion layer of the memory cell and the memory select gate and they are trapped in the ONO of the memory cell portion of the trench. There is negligible current through the channels of the select and memory transistors because the bitline and the deep trench source line are both at −5V. Inhibit cells sharing the same boosted MSG (cell C) will not be programmed since they see a low field between the bitline diffusion and memory select gate. Bitline current from cell C is relatively small because the Pwell is biased at −5V. The presence of the select transistor (thick gate dielectric) in series with the memory device avoids hot electrons from writing "0" to cell C. Additionally, inhibit cells sharing the same bitline (cell B), as the programmed cell will not be written because their memory select gates are at −5V. With electron injection into the ONO, the threshold voltage of the memory device should increase considerably and should significantly reduce current when being read.

b) Write "1" (or Erase "0"): To write a "1" into cell A shown in FIG. 11, the BL and the deep trench source line are biased to +5V. The memory select gate is biased to −5V, and the array Pwell is biased +5V. With these biasing conditions in the selected cells, hole injection into the ONO is dominant while trapped electrons are injected back into the bitline diffusion of the memory device by the high field between memory gate and bitline diffusion. All cells sharing the same memory gate select line (e.g., Cell C, memory gate select line 1) undergo the write "1"/erase operation. Once all the same memory gate line are written "1"/erase, write "0" is performed selectively to produce the desired bitline pattern. Inhibit cell B is not erased, nor does channel current flow, since its MSG, BL and deep trench source line are all at +5V.

c) Read: To read a "1" or "0" from cell A shown in FIG. 11, the BL is biased at a lower voltage (e.g., 1.5V) and the memory select gate is boosted to +1.5V. The array well and the deep trench source line are grounded. If no current is detected, this means that the threshold voltage if the memory device is too high to turn on and, hence, a "0" has been written into the cell. If current is detected, this means that the threshold voltage of the memory device is low (and quite likely negative) and the device is on; therefore, a "1" has been written into the cell (i.e., a depletion mode planar memory device). Neighboring inhibit cells can be grounded or even biased slightly negative to present the gate from being turned on.

Figure 12:
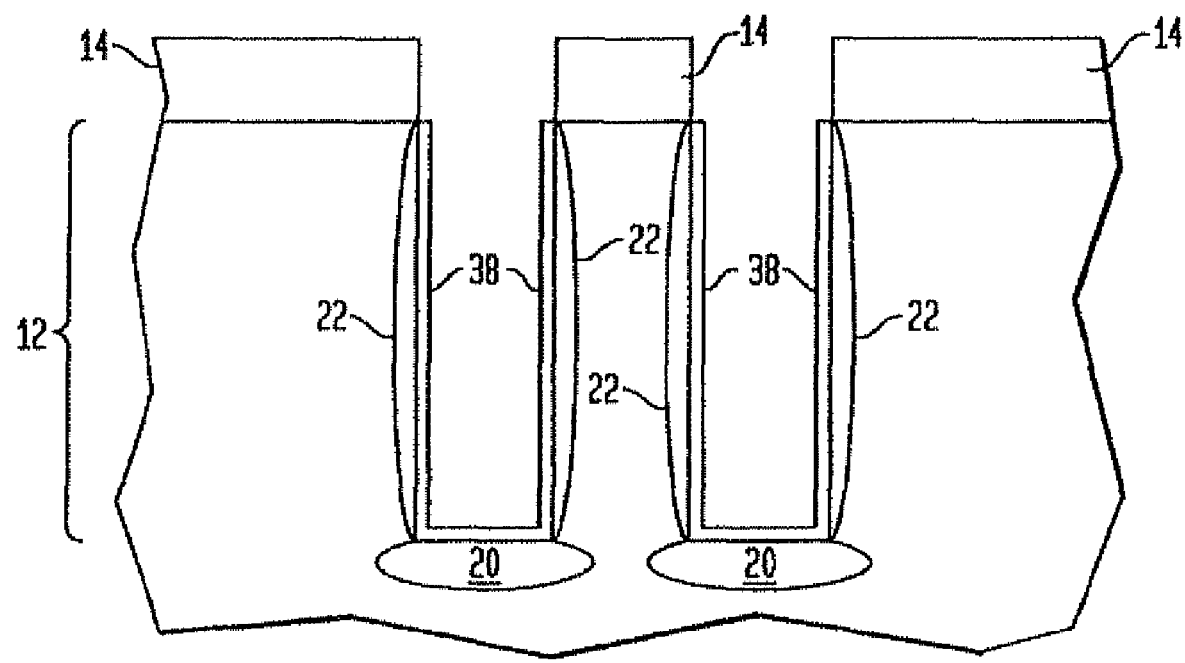
FIG. 12 is a pictorial representation (through a cross section view) illustrating an alternative 2-Tr SONOS memory cell that can be formed using the second embodiment of the present invention.

FIG. 12 shows an alternative embodiment to the second embodiment of the present invention in which a hot electron injection memory cell is formed. The alternative embodiment uses the same basic processing steps as described above for the second embodiment of the present invention except that no select gate dielectric is used. Instead, the ONO dielectric stack 38 is formed directly within each trench structure and processing proceeds as described in FIGS. 8-10 above. Note the ONO dielectric stack 38 is used as the gate insulating for both transistor devices.

Figure 13:
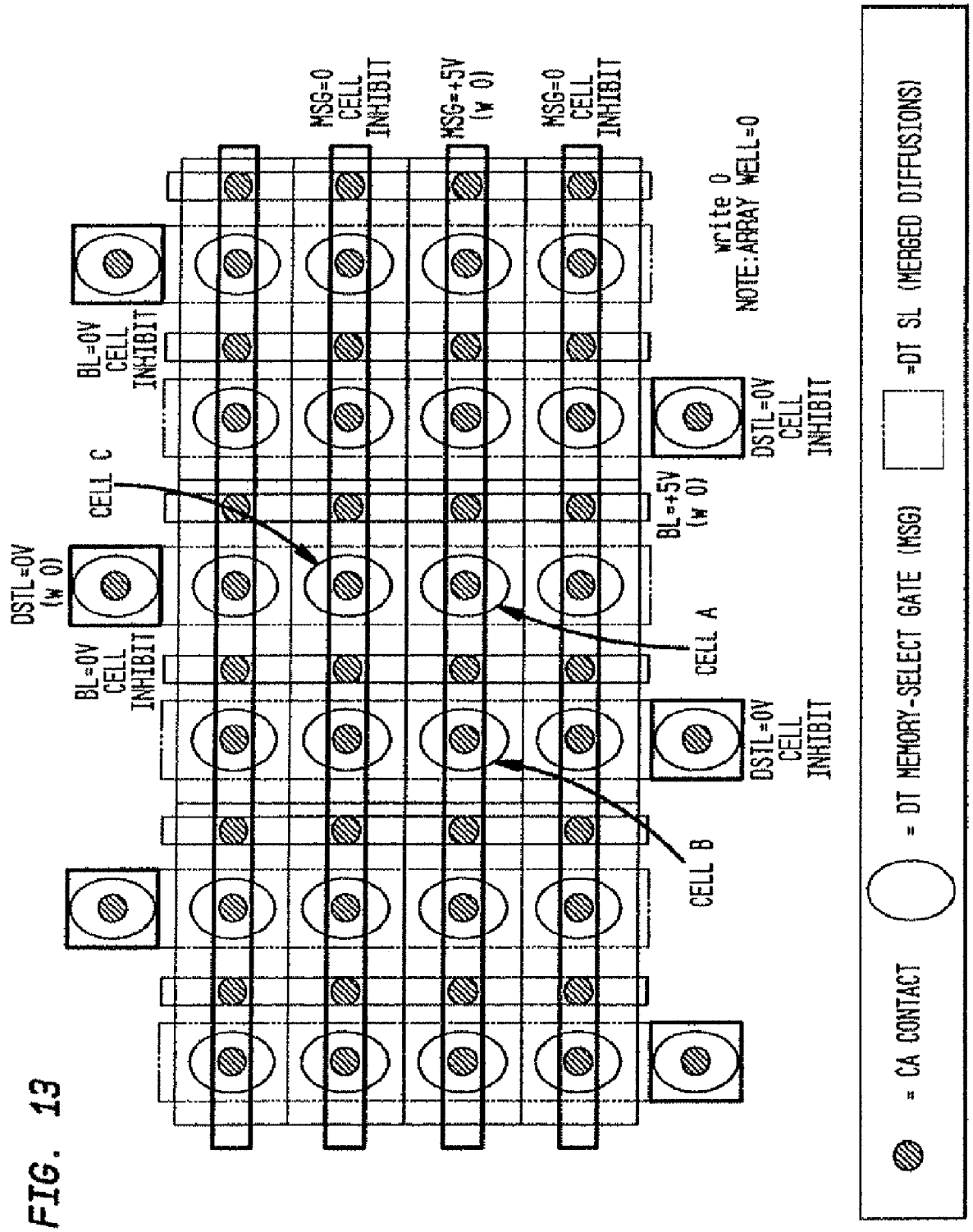
FIG. 13 is a cell layout (top-down view) including the inventive 2-Tr SONOS memory cell shown in FIG. 12.

The structure shown in FIG. 12 is referred to herein as a hot electron injection one trench SONOS memory cell. Note that is this embodiment, the bitlines run parallel to the deep trench source lines; the MSG runs perpendicular to the deep trench source and bitlines. Furthermore, the cell contains a single vertical memory MOSFET (ONO) within the trench to serve the dual propose as a memory device and as a select device. A possible cell layout for the cell provided by the second embodiment of the present invention is shown, for example, in FIG. 13. In the drawing, cells A-C are shown and will be described in connection with the electrical operations described below.

Electrical operations that may be performed on each memory cell in an array will now be described. The basic programming operations are a) Write "0", b) Write "1"/Erase and c) Read "1" or "0".

a) Write "0": To write a "0" into cell A shown in FIG. 13, the bitline (BL) is biased at +5V, and the deep trench source line is biased to ground. The memory select gate is boosted to +5V (or higher) and the array Pwell is biased to 0V. With these conditions, hot electron injection occurs and electrons rapidly get trapped in the ONO of the memory cell. Again, inhibit cells sharing a common boosted MSG (cell B) are not programmed since their bitlines are at zero. Channel current in cell B is zero since its Vds=0. Inhibit cells sharing a common bitline as the programmed cell (cell C) are not programmed since their MSGs are at 0V. With electron injection into the ONO, the threshold voltage of the memory device will increase to a value such that it can prevent channel current when being read.

b) Write "1" (or Erase "0"): The erase condition for this mode is similar to the erase mode described in the second embodiment. To write a "1"), the BL and the deep trench source line are biased at +5V. The memory select gate is biased −5V and the array Pwell is biased to +5V. With these biasing conditions in the selected cells, hole injection into the ONO is dominant while trapped electrons are injected back into the bitline diffusion of the memory device by the high field between the memory gates and the bitline diffusions. All cells sharing the same memory gate select line (e.g., cell B, memory select line 1) undergo the write "1"/erase operation. Once all cells on the same memory gate line are written, "1/erase, write "0" is performed selectively to produce the desired bitline pattern. Inhibit cells on the same bitline (cell C) are not erased since they see MSG at +5V.

c) Read: To read a "1" or "0", the bitline is biased at a lower voltage (e.g., 1.5V and the memory select gate is boosted to +1.5V. The array well and the deep trench source line are grounded. If no current is detected, this means that the threshold voltage of the memory cell is too high to turn on and, hence, a "0" has been written into the cell. If current is detected, this means that the threshold voltage of the memory device is low (and quite likely negative) and the device is on; therefore a "1" has been written into the cell (i.e., a depletion mode memory device). Memory select gates of neighboring inhibit cells can be slightly negative to prevent gate turn on.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a non-volatile random access memory cell comprising:
   forming a plurality of trench structures into an array region of a semiconductor substrate, wherein each of the trench structure has a depth from about 1 to about 2 µm;
   forming a source diffusion beneath each trench structure and forming a vertical select channel along sidewalls of each trench structure;
   forming a select transistor within each trench structure;
   providing a trench isolation region between selected trench structures, wherein the trench isolation region isolates a first select transistor in a first trench structure of the plurality of trench structures from a second select transistor in an adjacent trench structure of the plurality of trench structures, wherein the trench isolation region is present overlying a portion of a gate conductor of at least one of the first and second select transistor, and extends from a sidewall of the first trench structure through the semiconductor substrate to a sidewall of the adjacent trench structure; and
   forming a memory transistor including an oxide/nitride/oxide gate dielectric on a surface of said semiconductor substrate, said memory transistor is located adjoining said selected trench structures, in which a memory state is represented by a charge stored in the oxide/nitride/oxide gate dielectric, wherein a drain diffusion of the memory transistor is formed extending from an upper surface of the substrate between a gate structure of the memory transistor and a sidewall of the plurality of the trench structures, in which the drain diffusion of the memory transistor provides the drain diffusion of the select transistor.

2. The method of claim 1 wherein said source diffusion is formed by ion implantation and said select channel is formed utilizing an angle ion implant process.

3. The method of claim 1 wherein forming said select transistor comprising forming a select gate dielectric on bare sidewalls of each trench structure and then filling each trench structure with a conductive material.

4. The method of claim 1 further comprising forming a common buried source that contacts each diffusion source of each trench structure.

5. The method of claim 1 further comprising contacting a source diffusion at an upper surface of the substrate of said memory transistor to a bitline through a bitline contact and contacting the upper surface of the select transistor to a first metal level through a select gate contact.

6. A method of forming a non-volatile random access memory cell comprising:
   forming a plurality of trench structures into an array region of a semiconductor substrate, wherein each of the trench structure has a depth from about 1 to about 2 μm;
   forming a source diffusion beneath each trench structure and forming a vertical select channel along sidewalls of each trench structure;
   forming a select transistor within a lower portion of each trench structure;
   forming a memory transistor including an oxide/nitride/oxide gate dielectric within an upper portion of each trench structure, wherein a drain diffusion of the memory transistor is formed extending from an upper surface of the substrate between a gate structure of the memory transistor and a sidewall of the plurality of the trench structures, in which the drain diffusion of the memory transistor provides the drain diffusion of the select transistor; and
   forming a trench isolation region between selected trench structures, wherein the trench isolation region isolates a first select transistor in a first trench structure of the plurality of trench structures from a second select transistor in an adjacent trench structure of the plurality of trench structures, wherein the trench isolation region is present overlying a portion of a gate conductor of at least one of the first and second select transistor, and extends from the sidewall of the first trench structure through the semiconductor substrate to the sidewall of the adjacent trench structure.

7. The method of claim 6 wherein said source diffusion is formed by ion implantation and said select channel is formed utilizing an angle ion implant process.

8. The method of claim 6 wherein forming said select transistor comprising forming a select gate dielectric on bare sidewalls of each trench structure and removing said select gate dielectric from an upper portion of each of said trench structures.

9. The method of claim 6 wherein said oxide/nitride/oxide gate dielectric of said memory gate is also used as the select gate dielectric.

10. The method of claim 6 comprising contacting a source diffusion at an upper surface of the substrate of said memory transistor to a bitline through a bitline contact and contacting the upper surface of the select transistor to a first metal level through a select gate contact.

* * * * *